US011177001B2

(12) United States Patent
Liu et al.

(10) Patent No.: US 11,177,001 B2
(45) Date of Patent: Nov. 16, 2021

(54) 3D NAND FLASH AND OPERATION METHOD THEREOF

(71) Applicant: Yangtze Memory Technologies Co., Ltd., Wuhan (CN)

(72) Inventors: Hongtao Liu, Wuhan (CN); Dejia Huang, Wuhan (CN); Wenzhe Wei, Wuhan (CN); Ying Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/888,871

(22) Filed: Jun. 1, 2020

(65) Prior Publication Data
US 2021/0327511 A1 Oct. 21, 2021

Related U.S. Application Data

(63) Continuation of application No. PCT/CN2020/084874, filed on Apr. 15, 2020.

(51) Int. Cl.
| | |
|---|---|
| *G11C 16/10* | (2006.01) |
| *G11C 16/08* | (2006.01) |
| *G11C 16/04* | (2006.01) |
| *G11C 16/30* | (2006.01) |
| *G11C 16/34* | (2006.01) |
| *G11C 16/24* | (2006.01) |

(52) U.S. Cl.
CPC .......... *G11C 16/10* (2013.01); *G11C 16/0433* (2013.01); *G11C 16/08* (2013.01); *G11C 16/24* (2013.01); *G11C 16/30* (2013.01); *G11C 16/3436* (2013.01)

(58) Field of Classification Search
CPC ..... G11C 16/10; G11C 16/0433; G11C 16/08; G11C 16/24; G11C 16/30; G11C 16/3436
See application file for complete search history.

(56) References Cited

U.S. PATENT DOCUMENTS

| | | | |
|---|---|---|---|
| 9,087,608 B2 | 7/2015 | Kim | |
| 9,460,805 B1 * | 10/2016 | Pang | ...................... G11C 16/10 |
| 2006/0092703 A1 | 5/2006 | Chae | |
| 2009/0257281 A1 | 10/2009 | Lee | |
| 2012/0051137 A1 * | 3/2012 | Hung | ................. G11C 16/0466 |
| | | | 365/185.17 |

(Continued)

FOREIGN PATENT DOCUMENTS

| | | |
|---|---|---|
| CN | 101556827 A | 10/2009 |
| CN | 103578539 A | 2/2014 |

(Continued)

*Primary Examiner* — Tuan T Nguyen
(74) *Attorney, Agent, or Firm* — Winston Hsu

(57) ABSTRACT

A programming method of an increment step pulse program (ISPP) for a three-dimension (3D) NAND flash includes programming a select wordline of an unselect bit line of the 3D NAND flash; performing a first verification process with at least a verification voltage on the select wordline; determining whether a first verification voltage of the first verification process for the select wordline is higher than a default voltage or not; and removing a pre-pulse phase of the ISPP when the first verification voltage is higher than the default voltage; wherein the first verification voltage is a following verification voltage of the first verification process.

18 Claims, 4 Drawing Sheets

(56) References Cited

U.S. PATENT DOCUMENTS

| | | |
|---|---|---|
| 2012/0155168 A1 | 6/2012 | Kim |
| 2016/0118126 A1 | 4/2016 | Moon |
| 2017/0133095 A1* | 5/2017 | Park .................. G11C 16/0483 |
| 2019/0108883 A1 | 4/2019 | Yu |
| 2020/0005871 A1* | 1/2020 | Yang .................. G11C 16/0483 |

FOREIGN PATENT DOCUMENTS

| | | |
|---|---|---|
| CN | 104821183 A | 8/2015 |
| CN | 106486161 A | 3/2017 |
| CN | 108028070 A | 5/2018 |
| CN | 108389601 A | 8/2018 |
| CN | 110910922 A | 3/2020 |
| CN | 110959177 A | 4/2020 |

\* cited by examiner

US 11,177,001 B2

3D NAND FLASH AND OPERATION METHOD THEREOF

CROSS REFERENCE TO RELATED APPLICATIONS

This is a continuation application of International Application No. PCT/CN2020/084874 filed on Apr. 15, 2020, which is incorporated herein by reference.

BACKGROUND OF THE INVENTION

1. Field of the Invention

The present invention relates to a programming method for three-dimension (3D) NAND flash and a 3D NAND flash, and more particularly, to a programming method for 3D NAND flash and a 3D NAND flash capable of reducing a write time and power consumption of the 3D NAND flash.

2. Description of the Prior Art

In order to control threshold voltages in a write operation and implement storage of multiple data of a NAND flash memory, increment step pulse program (ISPP) technique is adopted. The ISPP technique is configured to interleave with program verify phases of the threshold voltage between two programming operations. Memory cells of the NAND flash memory, which pass the program verify phase, are performed inhibit program; memory cells of the NAND flash memory, which do not pass the program verify phase, are preceded to the ISPP technique. The ISPP technique includes a pre-charge phase and a programming phase, wherein the pre-charge phase enhances a coupling potential of channels and reduces programming interference. The program verify phases usually include a pre-pulse phase, a read phase and a pre-cutoff phase, wherein the pre-pulse phase and the pre-cutoff phase are utilized for reducing injection of electrons.

For a three-dimension (3D) NAND flash memory with vertical channel, in order to prevent leakage interference of voltage from unselect strings in the program verify phases, upper select gates of unselect strings are usually cut off and lower select gates of the unselect strings are turned on and shared. However, for an unselect string, when a memory cell corresponding to a wordline WLn of the unselect string is in a programming process, the wordline WLn is a select wordline and is verified by a verification voltage. When the verification voltage is smaller than a threshold voltage of the memory cell, the unselect strings of the select memory cell are turned off, a difference of channel potential between the wordline WLn and a wordline WLn+1 occurred, and interference is generated due to electron injection of the wordline WLn+1. A conventional solution to the above issue is to add the pre-pulse phase before the verify phase, but a writing time is thereby increased. Therefore, improvements are necessary to the prior arts.

SUMMARY OF THE INVENTION

The present invention provides a programming method for 3D NAND flash and a 3D NAND flash to reduce a write time and power consumption of the 3D NAND flash.

An embodiment of the present invention discloses a programming method of an increment step pulse program (ISPP) for a three-dimension (3D) NAND flash, comprises programming a select wordline of an unselect bit line of the 3D NAND flash; performing a first verification process with at least a verification voltage on the select wordline; determining whether a first verification voltage of the first verification process for the select wordline is higher than a default voltage or not; and removing a pre-pulse phase of the ISPP when the first verification voltage is higher than the default voltage; wherein the first verification voltage is a following verification voltage of the first verification process.

Another embodiment of the present invention discloses a three-dimension (3D) NAND flash, having a plurality of bit lines, wherein the plurality of bit lines comprises a plurality of wordline (WL) layers, the 3D NAND flash comprises a select bit line; at least an unselect bit line; and a controller, configured to program a select wordline of the unselect bit line of the 3D NAND, perform a first verification process with at least a verification voltage on the select wordline, determine whether a first verification voltage of the first verification process for the select wordline is higher than a default voltage or not, and remove a pre-pulse phase of the ISPP when the first verification voltage is higher than the default voltage; wherein the first verification voltage is a following verification voltage of the first verification process.

These and other objectives of the present invention will no doubt become obvious to those of ordinary skill in the art after reading the following detailed description of the preferred embodiment that is illustrated in the various figures and drawings.

DETAILED DESCRIPTION

A pre-pulse phase is included in an increment step pulse program (ISPP) for a three-dimension (3D) NAND flash. The pre-pulse phase of the ISPP turns on an unselect upper select gate to decrease a difference of channel potential, which increases a write time of the 3D NAND flash.

Figure 1:
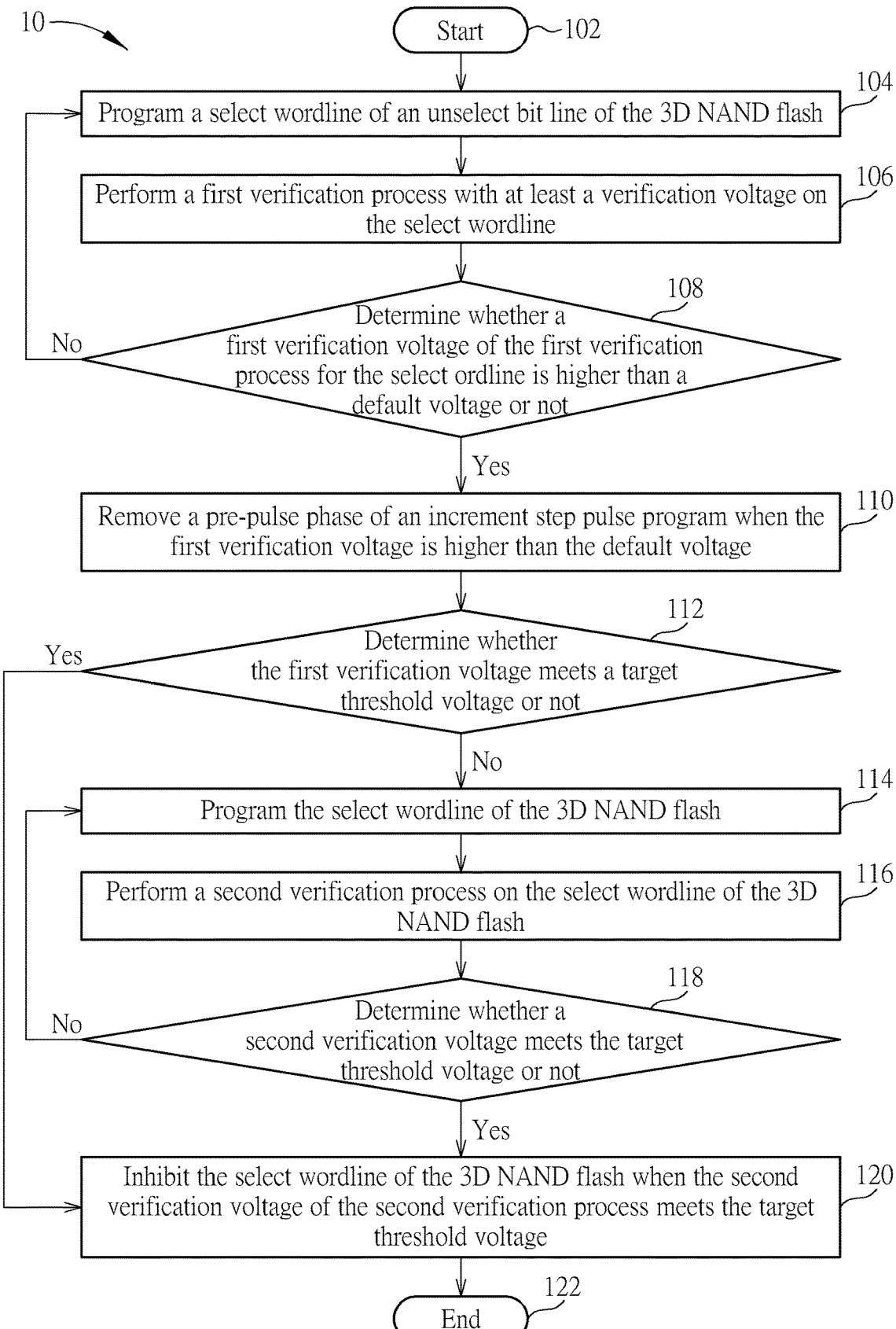
FIG. 1 is a schematic diagram of a programming process for a 3D NAND flash according to an embodiment of the present invention.

In order to reduce the write time of 3D NAND flash, FIG. 1 is a schematic diagram of a programming process 10 for a 3D NAND flash according to an embodiment of the present invention. The 3D NAND flash may include a plurality of bit lines, wherein the bit lines comprise a plurality of wordline (WL) layers. The programming process 10 for the 3D NAND flash includes the following steps:

Step 102: Start.

Step 104: Program a select wordline of an unselect bit line of the 3D NAND flash.

Step 106: Perform a first verification process with at least a verification voltage on the select wordline.

Step 108: Determine whether a first verification voltage of the first verification process for the select wordline is higher than a default voltage or not. If yes, go to step 110; if no, go to step 104.

Step 110: Remove a pre-pulse phase of an increment step pulse program (ISPP) when the first verification voltage is higher than the default voltage.

Step 112: Determine whether the first verification voltage meets a target threshold voltage or not. If yes, go to step 120; if no, go to step 114.

Step 114: Program the select wordline of the 3D NAND flash.

Step 116: Perform a second verification process on the select wordline of the 3D NAND flash.

Step 118: Determine whether a second verification voltage meets the target threshold voltage or not. If yes, go to step 120; if no, go to step 114.

Step 120: Inhibit the select wordline of the 3D NAND flash when the second verification voltage of the second verification process meets the target threshold voltage.

Step 122: End.

Figure 2:
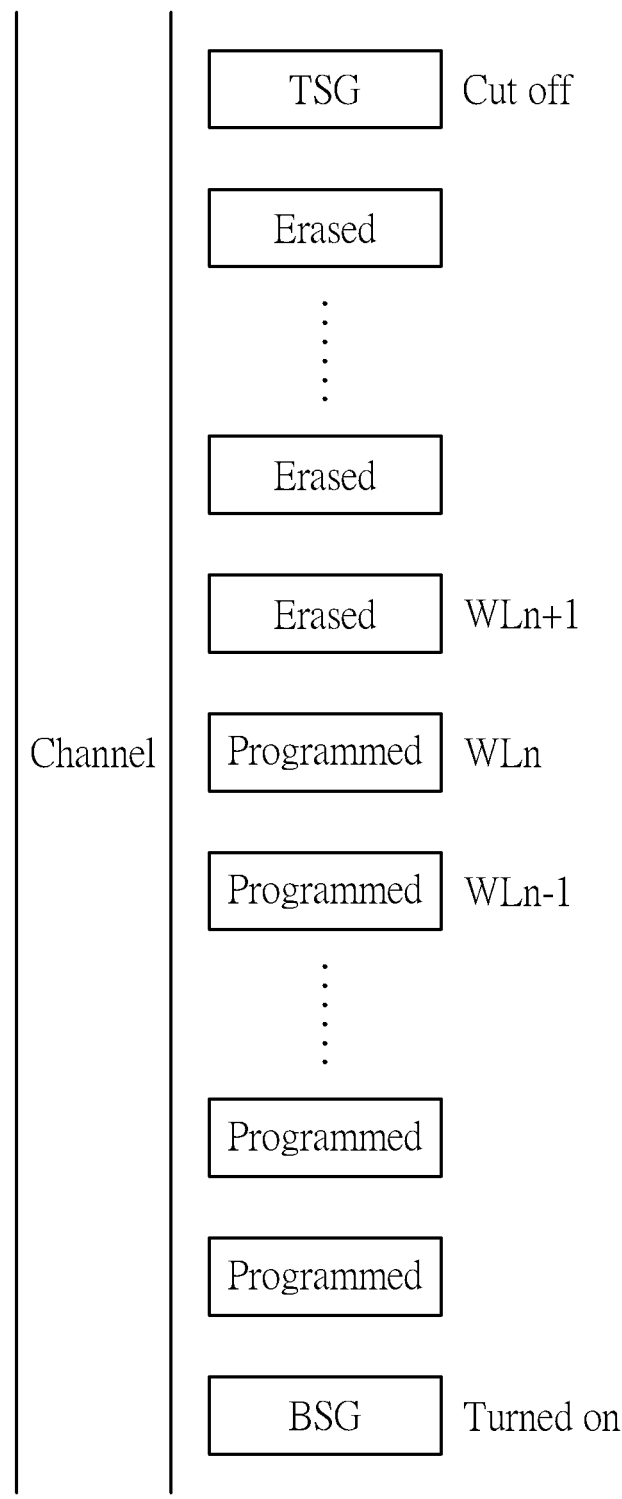
FIG. 2 is a schematic diagram of an unselect bit line of the 3D NAND flash applying the programming process according to an embodiment of the present invention.

The programming process 10 may be executed by a controller (not illustrated in the drawings) of the 3D NAND flash. As shown in FIG. 2, which is a schematic diagram of the unselect bit line of a 3D NAND flash applying the programming process 10 according to an embodiment of the present invention, the unselect bit line includes a top select gate TSG, a plurality of upper wordline layers, a wordline WLn layer, a plurality of lower wordline layers and a bottom select gate BSG.

Since the write operation of the 3D NAND flash may be started from one end of the top select gate TSG or the bottom select gate BSG, in an embodiment, the data is written from the bottom select gate BSG to the top select gate TSG, but is not limited thereto. The write operation of the 3D NAND flash may be started from the top select gate TSG to the bottom select gate BSG in other embodiments.

According to the programming process 10, in step 104, the select wordline WLn of the unselect bit line of the 3D NAND flash is programmed.

In an embodiment, the select wordline WLn is programmed by the ISPP. In step 106, the first verification process with at least a verification voltage on the select wordline WLn is performed. For example, when the 3D NAND flash is a multi-level cell (MLC) 3D NAND flash, memory cells of the 3D NAND flash may be programmed into four states corresponding to bit codes 11, 10, 01, 00, i.e. programmed states P0, P1, P2, P3, by verification voltages PV1, PV2, PV3 based on the first verification process. In another embodiment, when the 3D NAND flash is a triple-level cell (TLC) 3D NAND flash, memory cells of the 3D NAND flash may be programmed into eight states corresponding to bit codes 111, 110, 010, 011, 001, 000, 100, 101, by verification voltages PV1-PV7 based on the first verification process. Therefore, the select wordline WLn of the unselect bit line of the MLC 3D NAND flash may be programmed at the programmed state P1, P2 or P3.

In step 108, the first verification voltage of the first verification process for the select wordline WLn is determined to be higher than a default voltage or not. The first verification voltage is a following verification voltage of the first verification process. For example, when the select wordline WLn of the unselect bit line of the MLC 3D NAND flash is programmed at the programmed state P1, the first verification voltage of the first verification process is the programmed state P2 and is utilized for the determination of step 108.

In step 110, when the first verification voltage is higher than the default voltage, the pre-pulse phase of the ISPP is removed. In contrast, when the first verification voltage is lower than or equal to the default voltage, the programming process 10 goes to step 104.

Figure 3:
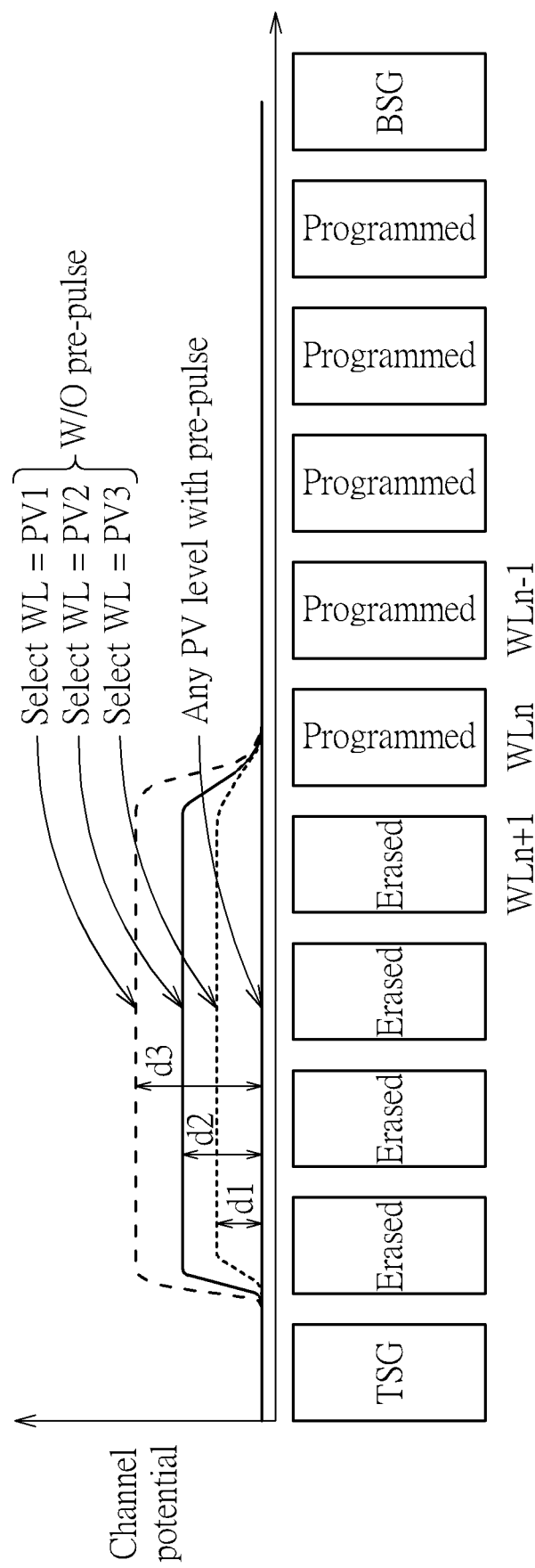
FIG. 3 is a schematic diagram of distributions of channel potential of an unselect bit line of the 3D NAND flash according to an embodiment of the present invention.

Please refer to FIG. 3, which is a schematic diagram of distributions of channel potential of the unselect bit line of the 3D NAND flash according to an embodiment of the present invention. FIG. 3 illustrates the distributions of channel potential when the select wordline WLn layer passes the verification voltages PV1, PV2 and PV3 without the pre-pulse phase and a distribution of channel potential when the select wordline WLn layer passes any verification voltage with the pre-pulse phase.

Accordingly, when the first verification voltage is between the verification voltage PV2 and the verification voltage PV3, a difference d1 between the verification voltage PV3 and any verification voltage with the pre-pulse phase is reduced. In addition, the electrons injected from a wordline layer WLn+1, which is in an erased state, to the wordline layer WLn, which is in a programmed state, of the unselect bit line is reduced in comparison to differences d2 and d3.

After the pre-pulse phase of the ISPP is removed, in step 114, the select wordline WLn of the 3D NAND flash is programmed. In step 116, a second verification process is performed on the select wordline WLn of the 3D NAND flash. Different from the first verification process, which verifies the memory cells of the 3D NAND flash respectively based on the verification voltages PV1, PV2, PV3, that is, from a lower programmed state to a higher programmed state, the second verification process is configured to verify the memory cells of the 3D NAND flash from a higher programmed state to a lower programmed state. For example, if the MLC 3D NAND flash is programmed at the programmed state P0 in the first verification process and the first verification voltage is higher than the default voltage, the second verification process firstly verifies the MLC 3D NAND flash at the programmed state P2 and then verifies the programmed state P1, which reduces an amount of cells of the MLC 3D NAND flash for the verification at lower programmed states.

In step 118, a second verification voltage of the second verification process is determined to be higher than the target threshold voltage or not, wherein the second verification voltage is a following verification voltage of the second verification process. For example, when the select wordline WLn of the unselect bit line of the MLC 3D NAND flash is programmed at the programmed state P2, the second verification voltage of the second verification process is the programmed state P3 and is utilized for the determination of step 118.

When the second verification voltage is higher than the target threshold voltage, the programming process 10 goes to step 120. In contrast, when the second verification voltage is lower than or equal to the target threshold voltage, the programming process 10 goes to step 114.

Figure 4:
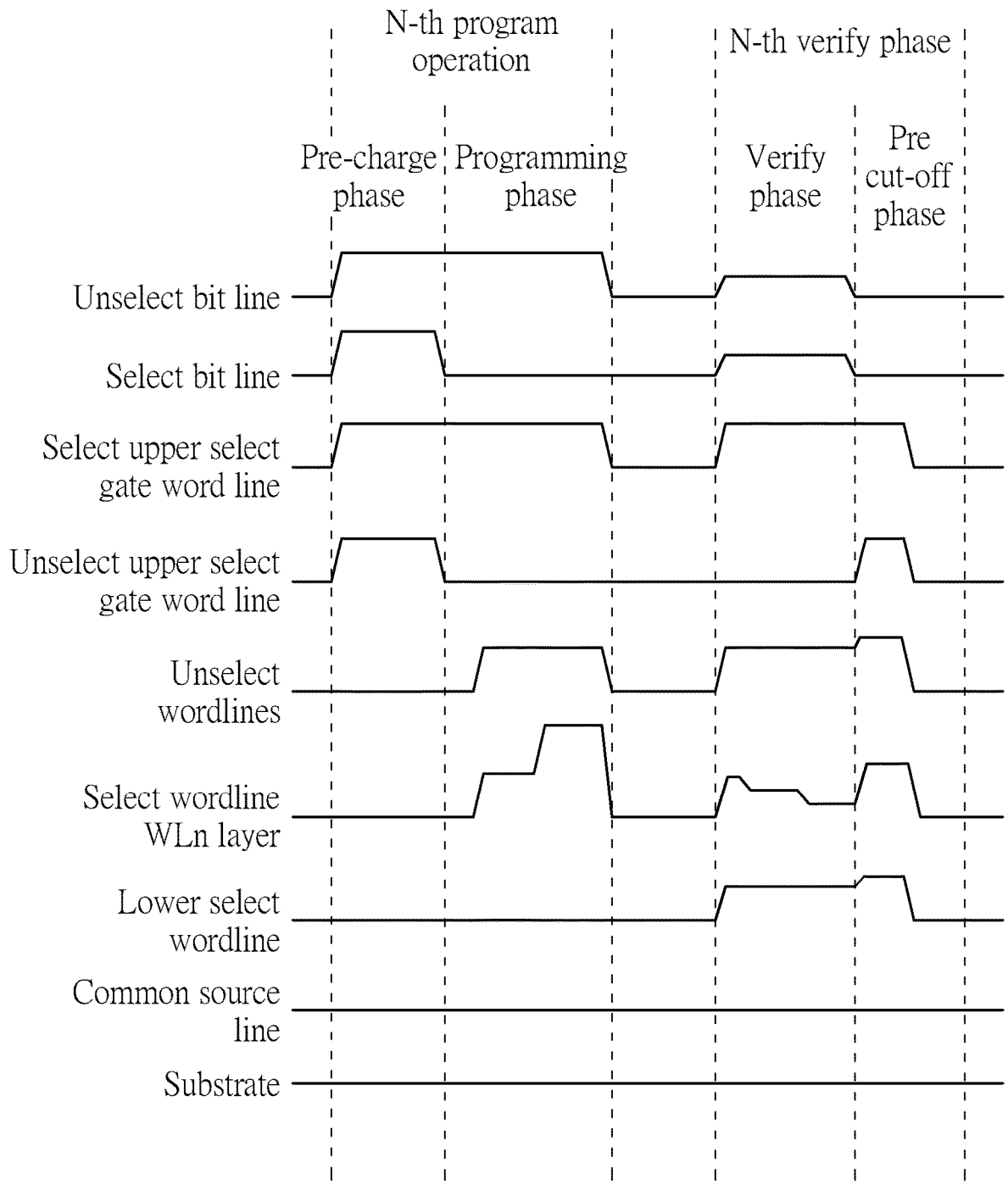
FIG. 4 is a waveform diagram of the select bit string of the 3D NAND flash applying the programming process according to an embodiment of the present invention.

Please refer to FIG. 4, which is a waveform diagram of the unselect bit string of the 3D NAND flash applying the programming process 10 according to an embodiment of the present invention. As shown in FIG. 4, the unselect bit string includes an unselect bit line, a select bit line, a select upper select gate word line, the unselect wordlines, the select wordline WLn layer, a lower select wordline, a common source line and a substrate. In FIG. 4, after an N-th program operation, which includes a pre-charge phase and a programming phase, an N-th verify phase, which includes the verify phase and a pre cut-off phase, is performed.

As illustrated in FIG. 4, the pre-pulse phase of the N-th verify phase is removed and the select wordline WLn is verified from a higher programmed state to a lower programmed state, which reduces the write time of the 3D NAND flash and reduces the electron injection between the wordline WLn+1 and the wordline WLn. As such, the interference is reduced.

In step 120, the select wordline WLn of the 3D NAND flash is inhibited when the first verification voltage meets the target threshold voltage in step 112 or when the second verification voltage of the second verification process meets the target threshold voltage in step 118.

Notably, the embodiments stated above illustrate the concept of the present invention, those skilled in the art may make proper modifications accordingly, for example, other kinds of 3D NAND flash, e.g. quad-level cell (QLC) and single-level cell (SLC), are all within the scope of the present invention, and not limited thereto.

In summary, the present invention provides a programming method for 3D NAND flash and a 3D NAND flash, which reduces a write time of the 3D NAND flash by removing a pre-pulse phase of the ISPP, power consumption and electron injection between wordline layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A programming method of an increment step pulse program (ISPP) for a three-dimension (3D) NAND flash, comprising:
   programming a select wordline of a unselect bit line of the 3D NAND flash;
   performing a first verification process with at least a verification voltage on the select wordline;
   determining whether a first verification voltage of the first verification process for the select wordline is higher than a default voltage or not; and
   removing a pre-pulse phase of the ISPP when the first verification voltage is higher than the default voltage;
   wherein the first verification voltage is a following verification voltage of the first verification process.

2. The programming method of claim 1, further comprising:
   programming the select wordline of the 3D NAND flash when the first verification voltage is lower than or equal to the default voltage.

3. The programming method of claim 1, further comprising:
   determining whether the first verification voltage meets a target threshold voltage or not.

4. The programming method of claim 3, further comprising:
   programming the select wordline of the 3D NAND flash when the first verification voltage does not meet a target threshold voltage; and
   performing a second verification process on the select wordline of the 3D NAND flash.

5. The programming method of claim 4, further comprising:
   inhibiting the select wordline of the 3D NAND flash when a second verification voltage of the second verification process meets the target threshold voltage;
   wherein the second verification voltage is a following verification voltage of the second verification process.

6. The programming method of claim 3, further comprising:
   inhibiting the select wordline of the 3D NAND flash when the first verification voltage meets the target threshold voltage.

7. A three-dimension (3D) NAND flash, having a plurality of bit lines, wherein the plurality of bit lines comprises a plurality of wordline (WL) layers, the 3D NAND flash comprising:
   a select bit line;
   at least an unselect bit line; and
   a controller, configured to program a select wordline of the unselect bit line of the 3D NAND, perform a first verification process with at least a verification voltage on the select wordline, determine whether a first verification voltage of the first verification process for the select wordline is higher than a default voltage or not, and remove a pre-pulse phase of the ISPP when the first verification voltage is higher than the default voltage;
   wherein the first verification voltage is a following verification voltage of the first verification process.

8. The 3D NAND flash of claim 7, wherein the controller is configured to program the select wordline of the 3D NAND flash when the first verification voltage is lower than or equal to the default voltage.

9. The 3D NAND flash of claim 7, wherein the controller is configured to determine whether the first verification voltage meets a target threshold voltage or not.

10. The 3D NAND flash of claim 9, wherein the controller is configured to program the select wordline of the 3D NAND flash when the first verification voltage does not meet a target threshold voltage, and perform a second verification process with on the select wordline of the 3D NAND flash.

11. The 3D NAND flash of claim 10, wherein the controller is configured to inhibit the select wordline of the 3D NAND flash when a second verification voltage of the second verification process meets the target threshold voltage, wherein the second verification voltage is a following verification voltage of the second verification process.

12. The 3D NAND flash of claim 9, wherein the controller is configured to inhibit the select wordline of the 3D NAND flash when the first verification voltage meets the target threshold voltage.

13. An electronic device, having a three-dimension (3D) NAND flash, the 3D NAND flash comprises a plurality of bit lines having a plurality of wordline (WL) layers, and the 3D NAND flash comprising:
   a select bit line;
   at least an unselect bit line; and
   a controller, configured to program a select wordline of the unselect bit line of the 3D NAND, perform a first verification process with at least a verification voltage on the select wordline, determine whether a first verification voltage of the first verification process for the select wordline is higher than a default voltage or not, and remove a pre-pulse phase of the ISPP when the first verification voltage is higher than the default voltage;
   wherein the first verification voltage is a following verification voltage of the first verification process.

14. The electronic device of claim 13, wherein the controller is configured to program the select wordline of the 3D NAND flash when the first verification voltage is lower than or equal to the default voltage.

15. The electronic device of claim 13, wherein the controller is configured to determine whether the first verification voltage meets a target threshold voltage or not.

16. The electronic device of claim 15, wherein the controller is configured to program the select wordline of the 3D NAND flash when the first verification voltage does not meet a target threshold voltage, and perform a second verification process with on the select wordline of the 3D NAND flash.

17. The electronic device of claim 16, wherein the controller is configured to inhibit the select wordline of the 3D NAND flash when a second verification voltage of the second verification process meets the target threshold voltage, wherein the second verification voltage is a following verification voltage of the second verification process.

18. The electronic device of claim 15, wherein the controller is configured to inhibit the select wordline of the 3D NAND flash when the first verification voltage meets the target threshold voltage.

* * * * *